US011652034B2

(12) United States Patent
Becker et al.

(10) Patent No.: US 11,652,034 B2
(45) Date of Patent: May 16, 2023

(54) DIRECT CURRENT BLOCKING CAPACITORS AND METHOD OF ATTACHING AN IC PACKAGE TO A PCB

(71) Applicant: International Business Machines Corporation, Armonk, NY (US)

(72) Inventors: Darryl Becker, Rochester, MN (US); Mark J. Jeanson, Rochester, MN (US); Gerald Bartley, Rochester, MN (US); Matthew Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/132,041

(22) Filed: Dec. 23, 2020

(65) Prior Publication Data

US 2021/0118784 A1    Apr. 22, 2021

Related U.S. Application Data

(62) Division of application No. 16/200,748, filed on Nov. 27, 2018, now Pat. No. 10,916,493.

(51) Int. Cl.
*H05K 1/18*    (2006.01)
*H01L 23/498*    (2006.01)
(Continued)

(52) U.S. Cl.
CPC ........ *H01L 23/49811* (2013.01); *H01L 23/58* (2013.01); *H05K 1/0243* (2013.01);
(Continued)

(58) Field of Classification Search
CPC ....... H01L 23/50; H01L 23/58; H01L 23/642; H05K 1/02; H05K 1/0243; H05K 1/18;
(Continued)

(56) References Cited

U.S. PATENT DOCUMENTS 5,982,633 A    11/1999   Jeansonne
6,292,351 B1 *  9/2001   Ahiko ................... H01G 4/228
                                                    361/308.1
(Continued)

OTHER PUBLICATIONS

IBM, "Self Aligning Interconnecting Capacitor", An IP.com Prior Art Database Technical Disclosure, IP.com No. IPCOM000181693D, IP.com Electronic Publication Date: Apr. 9, 2009, 3 pages.
(Continued)

*Primary Examiner* — Tuan T Dinh
(74) *Attorney, Agent, or Firm* — Jeffrey M. Ingalls (57) ABSTRACT

A method of attaching an integrated circuit (IC) package to a printed circuit board (PCB) with a set of direct current (DC) blocking capacitors includes: applying a conductive attachment material to a first set of attachment pads located on a first planar surface of the IC package; aligning the set of DC blocking capacitors in accordance with corresponding positions of the first set of attachment pads; attaching the set of DC blocking capacitors to the IC package by: positioning the aligned set of DC blocking capacitors so that a first surface of a first DC blocking capacitor of the set of DC blocking capacitors is adjacent to a corresponding attachment pad of the first set of attachment pads; and connecting the conductive attachment material to the IC package and to the first surface of the first DC blocking capacitor to create an IC package assembly.

13 Claims, 7 Drawing Sheets

(51) Int. Cl.
*H01L 23/58* (2006.01)
*H05K 1/02* (2006.01)
*H05K 3/34* (2006.01)
*H01G 4/30* (2006.01)
*H01G 4/232* (2006.01)

(52) U.S. Cl.
CPC ............ *H05K 1/181* (2013.01); *H05K 3/3436* (2013.01); *H01G 4/232* (2013.01); *H01G 4/30* (2013.01); *H05K 2201/10015* (2013.01); *H05K 2201/1053* (2013.01); *H05K 2201/10378* (2013.01); *H05K 2201/10515* (2013.01)

(58) Field of Classification Search
CPC ... H05K 1/181–187; H05K 2201/1053; H05K 2201/10515; H05K 2201/10015; H05K 2201/10378; H01G 4/232; H01G 4/30; H01G 4/38; H01G 4/40
USPC ........ 361/303–309, 760–764, 767, 770–790, 361/795
See application file for complete search history.

(56) References Cited

U.S. PATENT DOCUMENTS

| | | | |
|---|---|---|---|
| 6,336,262 B1 | 1/2002 | Dalal et al. | |
| 6,411,492 B1* | 6/2002 | Kar-Roy | H01L 28/90 257/E21.018 |
| 6,418,029 B1* | 7/2002 | McKee | H05K 1/145 361/803 |
| 6,426,970 B1 | 7/2002 | Thornton et al. | |
| 6,831,824 B1* | 12/2004 | Devoe | H01G 2/065 361/321.1 |
| 7,262,974 B2 | 8/2007 | Yang et al. | |
| 7,633,739 B2* | 12/2009 | Devoe | H01G 4/30 361/308.1 |
| 7,964,802 B2* | 6/2011 | Hoffmann | H05K 1/0231 361/768 |
| 8,446,705 B2* | 5/2013 | Ritter | H01G 4/012 361/321.1 |
| 8,575,721 B2 | 11/2013 | Okamura | |
| 8,643,141 B2 | 2/2014 | Lu et al. | |
| 8,742,260 B2* | 6/2014 | Sato | H05K 3/368 174/254 |
| 8,791,768 B2 | 7/2014 | Yiu et al. | |
| 9,257,834 B1 | 2/2016 | Moghe et al. | |
| 9,414,496 B2 | 8/2016 | Williams et al. | |
| 10,120,406 B1 | 11/2018 | Susanto et al. | |
| 2003/0107450 A1 | 6/2003 | Jamal et al. | |
| 2004/0124511 A1* | 7/2004 | Li | H05K 1/0212 257/678 |
| 2004/0125516 A1 | 7/2004 | Brand et al. | |
| 2004/0125580 A1* | 7/2004 | Chung | H05K 1/0231 361/794 |
| 2007/0097658 A1 | 5/2007 | Yang et al. | |
| 2007/0188975 A1* | 8/2007 | Togashi | H05K 3/3426 361/306.3 |
| 2008/0079455 A1 | 4/2008 | Vollrath et al. | |
| 2010/0246149 A1* | 9/2010 | Nakashima | H01L 23/49827 361/767 |
| 2011/0011634 A1 | 1/2011 | Moldauer et al. | |
| 2011/0104948 A1* | 5/2011 | Girard, Jr. | H05K 3/34 174/262 |
| 2013/0235542 A1 | 9/2013 | Song et al. | |
| 2015/0001716 A1 | 1/2015 | Chan et al. | |
| 2015/0294791 A1* | 10/2015 | Hwang | H01G 4/33 29/25.03 |
| 2017/0041044 A1 | 2/2017 | Ivanov et al. | |
| 2017/0064837 A1* | 3/2017 | Li | H05K 1/113 |
| 2017/0194245 A1* | 7/2017 | Patil | H01L 21/76804 |
| 2018/0226367 A1 | 8/2018 | Babcock et al. | |
| 2020/0168535 A1 | 5/2020 | Becker et al. | |

OTHER PUBLICATIONS

Anonymous, "Method for a PCI Express TX buffer characterization pad", An IP.com Prior Art Database Technical Disclosure, IP.com No. IPCOM000145867D, IP.com Electronic Publication Date: Jan. 30, 2007, 4 pages.

Motorola et al., "An IC Interconnect Capacitor with Optimal Lateral Flux Coupling and RF Performance", An IP.com Prior Art Database Technical Disclosure,IP.com No. IPCOM000010776D, IP.com Electronic Publication Date: Jan. 20, 2003, 6 pages.

Anonymous, "Method for a full grid socket using IDC capacitors", An IP.com Prior Art Database Technical Disclosure, IP.com No. IPCOM000145861D, IP.com Electronic Publication Date: Jan. 30, 2007, 6 pages.

List of IBM Patents or Patent Applications Treated as Related, Appendix P, dated Dec. 22, 2020, 2 pages.

* cited by examiner

600 DC Blocking Capacitors (Top View)

650 DC Blocking Capacitor Positioning Mask (Top View)

DIRECT CURRENT BLOCKING CAPACITORS AND METHOD OF ATTACHING AN IC PACKAGE TO A PCB

BACKGROUND

The present disclosure generally relates to integrated circuit (IC) packaging and assembly. In particular, this disclosure relates to direct current (DC) blocking capacitors integrated into an electronic system including a printed circuit board (PCB).

Integrated circuits ICs can be assembled into protective packages which can allow simplified handling and assembly onto PCBs and which can also protect the ICs from external damage. IC packages include a large variety of different sizes, types, and physical/electrical configurations. IC package material types can include organic materials, e.g., plastics, and non-organic materials such as ceramics. Some IC package types can have standardized dimensions and tolerances, and can be registered with trade industry associations such as the Joint Electron Device Engineering Council (JEDEC). Other IC package types can use proprietary dimension and tolerance designations which may be made by only a small number of manufacturers. IC packaging can be the last assembly process before the testing and shipping of devices to customers.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electronic devices such as digital and analog ICs. A capacitor may have a value tolerance which may be a limited allowable deviation from a designed or specified capacitance value. Capacitor tolerances may be specified as a percent of the specified target capacitance value, for example 10%. Circuits employing capacitors with relatively small tolerance values may perform and produce outputs with greater predictability than circuits employing capacitors with larger tolerances.

SUMMARY

Embodiments may be directed towards a direct current (DC) blocking capacitor for use with an integrated circuit (IC) package. The DC blocking capacitor can include a first planar surface that is electrically conductive, the first planar surface having a first area. The DC blocking capacitor can also include a second planar surface that is electrically conductive, the second planar surface having a second area greater than the first area. The second planar surface can be in a parallel planar orientation to the first planar surface. The DC blocking capacitor can also include a first set of electrically conductive plates electrically connected to the first planar surface and a second set of electrically conductive plates electrically connected to the second planar surface. The second set of electrically conductive plates are interleaved with and electrically insulated from the first set of electrically conductive plates by a dielectric material.

Embodiments may also be directed towards an electronic system. The electronic system can include an IC package, the IC package having a first set of attachment pads that are electrically conductive and a printed circuit board (PCB) having a second set of attachment pads that are electrically conductive and that correspond positionally to the first set of attachment pads. The electronic system can also include a set of DC blocking capacitors, each DC blocking capacitor of the set of DC blocking capacitors electrically connected in a series configuration within a data transmission circuit. A first DC blocking capacitor of the set of DC blocking capacitors can have a first surface electrically interconnected to an attachment pad of the first set of attachment pads and a second surface electrically connected to a corresponding attachment pad of the second set of attachment pads.

Embodiments may also be directed towards a method of attaching an IC package to a PCB with a set of DC blocking capacitors. Each DC blocking capacitor of the set of DC blocking capacitors is electrically connected in a series configuration within a data transmission circuit. The method can include applying a first conductive attachment material to a first set of attachment pads located on a first planar surface of the IC package and aligning the set of DC blocking capacitors in accordance with corresponding positions of the first set of attachment pads. The method can also include attaching the set of DC blocking capacitors to the IC package. Attaching the set of DC blocking capacitors to the IC package can include positioning the aligned set of DC blocking capacitors so that a first surface of a first DC blocking capacitor of the set of DC blocking capacitors is adjacent to a corresponding attachment pad of the first set of attachment pads. Attaching the set of DC blocking capacitors to the IC package can also include connecting the conductive attachment material to the IC package and to the first surface of the first DC blocking capacitor to create an IC package assembly.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing reduced printed circuit board (PCB) area and enhanced high-speed serial bus signal integrity for electronic systems such as servers, which can be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing reduced PCB area and enhanced high-speed serial bus signal integrity to electronic systems such as computing systems, which may be used in a wide variety of computational and data processing applications. Such computing systems may include, but are not limited to, supercomputers, high-performance computing (HPC) systems, and other types of special-purpose computers. Embodiments may also be directed towards providing reduced PCB area and enhanced high-speed serial bus signal integrity for personal computers, laptops, various mobile devices and small office/home office (SOHO) computing equipment.

The terms "mask," "tray" and "boat" can be used interchangeably herein in reference to a container used to hold direct current (DC) blocking capacitors in a fixed orientation that corresponds to the position of one or more sets of attachment pads. Such a container includes a set of openings configured to receive and hold the set of DC blocking capacitors.

The terms "attachment pad," and "ball grid array (BGA) pad" can be used interchangeably herein in reference to a metallic pad used to form an electrical and mechanical interconnection to an integrated circuit (IC) package or a PCB. Such pads can be include metals such as copper or copper alloys, and can be arranged in arrays that are positionally consistent with solder balls on a BGA electronic package. In the context of the present disclosure, attachment pads can be used as locations on which to mount, e.g., solder, DC blocking capacitors and electrically conductive elements such as "0-ohm resistors."

For ease of discussion, the terms "solder, "solder paste" and "solder balls" are used generally herein in reference to a conductive attachment material used to form a durable mechanical and electrical interconnection between an IC package and a PCB. While solder paste is commonly used as a conductive attachment material between an IC package and a PCB, other materials can also be used for such purposes. For example, a conductive epoxy or conductive elastomeric material can be used to provide electrical and mechanical conductivity between an IC package and a PCB. Also for ease of discussion, application and reflow method operations discussed herein are directed towards the use of solder paste, however it can be easily understood that variations of these operations applicable to such materials as conductive epoxy or conductive elastomeric material can be used in certain embodiments.

Current electronic systems such as computers, servers, and telecom equipment often include ICs that are interconnected by high-speed serial links or buses. The specifications for these high-speed serial links, e.g., Peripheral Component Interconnect Express (PCIe), Universal Serial Bus (USB) or Serial Advanced Technology Attachment (SATA) links, often require that DC blocking capacitors be connected in series between corresponding link transmitters and receivers. For example, the PCI Express Base Specification (PCI-SIG 2004a) specifies that a capacitance of 200 nF be series-connected between a PCIe driver and PCIe receiver.

Such DC blocking capacitors can be used to block a flow of DC current, caused by a difference of DC bias voltages between a transmitter and a receiver, thus allowing the transmitter and receiver to operate with separate bias voltages. DC blocking capacitors can also be used to isolate the transmitter's and receiver's grounds from each other, which can be useful in accommodating differences in ground voltage between various plug-in cards within a system.

While it may be theoretically possible to fabricate capacitances on the order of 200 nF on an IC die, the large proportion of IC area required to do so can make this impractical for many ICs. In many applications, therefore, the specified DC blocking capacitors are located on a PCB adjacent to an IC that includes a high-speed serial link transmitter or receiver. Each high-speed serial link, e.g., PCIe, can include several lanes, each having multiple differential pairs of signals, an thus, a significant number of DC blocking capacitors may be required to be located on the PCB near the IC. These DC blocking capacitors can consume an appreciable placement area on the PCB, which can drive up the PCB size, cost, and complexity of design and manufacturing. A large number of DC blocking capacitors between transmit and receive ICs on a PCB can also increase the length and complexity of high-speed serial link wire routing between ICs or other components, which can have detrimental effects on integrity of the high-speed serial link signals. As high-speed serial link signaling frequencies increase, for example, towards 10 Gb/s/direction, the integrity of high-speed serial link signals becomes increasingly vulnerable to wiring length, topology/continuity, and resulting electrical parasitics.

Embodiments of the present disclosure are directed towards repositioning DC blocking capacitors located in PCB area(s) adjacent to an IC to the interconnect area, i.e., "pin field," between the IC package/module and the PCB. In some embodiments DC blocking capacitors can replace solder balls as interconnect structures between a BGA package and a PCB.

In embodiments, relocating the DC blocking capacitors to this interconnect area can decrease both overall PCB area used by DC blocking capacitors and distances between ICs on the PCB having high-speed serial links. This IC placement distance reduction can result in shortened serial link wire length and simplified/improved PCB wiring topology Eliminating DC blocking capacitors mounted on the surface of a PCB can provide enhanced signal integrity by eliminating signal path discontinuities and providing physically and electrically consistent interconnect structures for high-speed serial signals. According to embodiments, DC blocking capacitor types can include established size surface-mount technology (SMT) capacitors and/or various capacitors having customized physical shapes and surfaces.

Such custom-shaped capacitors can be particularly useful within a manufacturing process of mounting an IC package to a PCB.

An electronic system designed according to certain embodiments may be compatible with existing and proven electronic components and PCBs, and may be a useful and cost-effective way to manage PCB area usage and enhance signal integrity of high-speed serial data transmission circuits.

Figure 1:
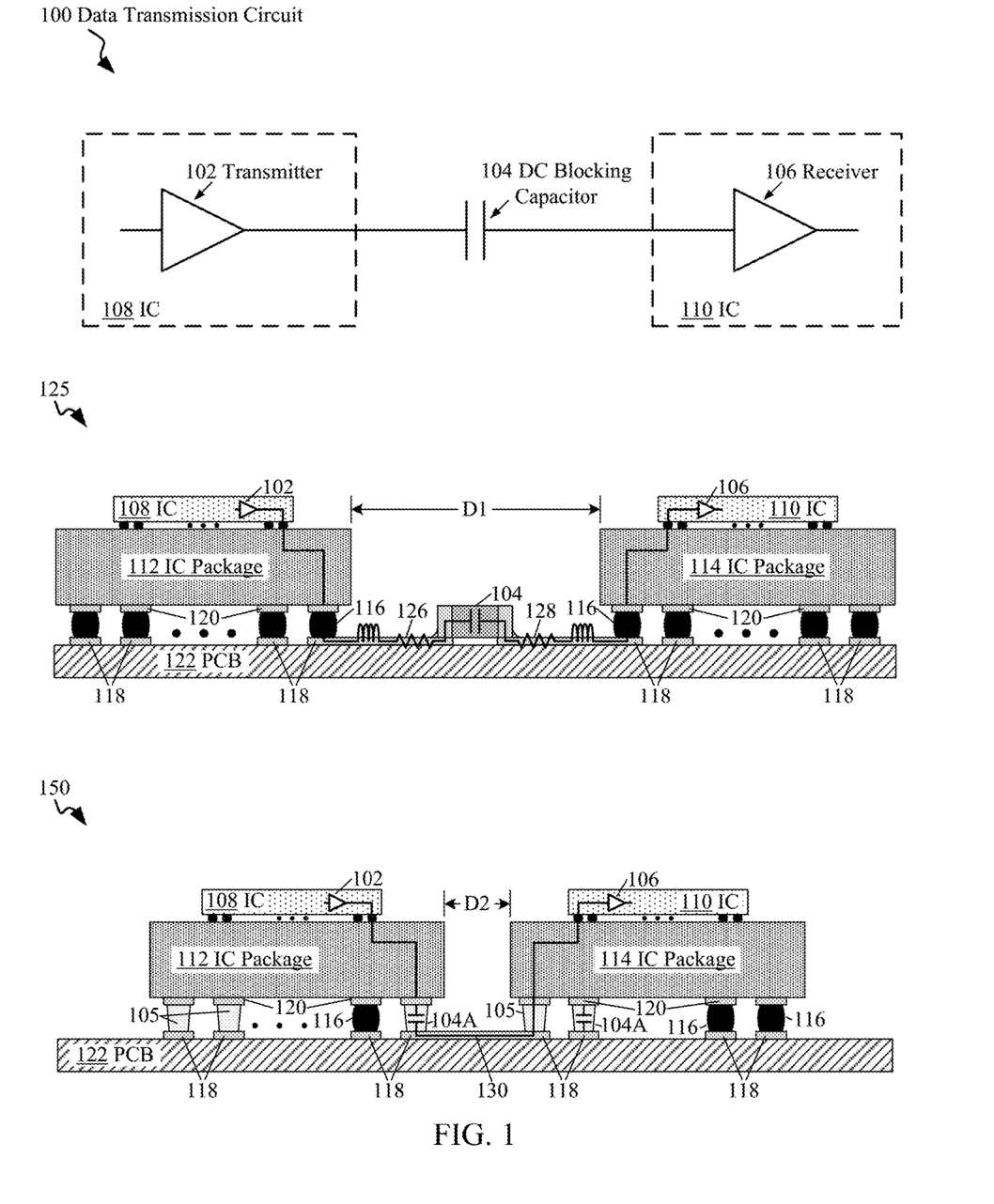
FIG. 1 includes a schematic depiction and two cross-sectional side views of a data transmission circuit, according to embodiments of the present disclosure.

FIG. 1 includes a schematic diagram and two consistent cross-sectional side views 125 and 150 of a data transmission circuit 100, according to embodiments of the present disclosure.

Data transmission circuit view 100 can be useful in providing an understanding of a circuit topology that is used in a variety of high-speed serial links/interfaces, for example, PCIe and USB 3.0. As described above, the inclusion of a series-connected DC blocking capacitor 104 within a high-speed serial link can be useful in blocking DC current flow between a transmitter 102 and a receiver 106, allowing the transmitter 102 and receiver 106 to operate with separate bias voltages. Series-connected DC blocking capacitors can also be useful in accommodating differences in ground voltage between various plug-in cards within an electronic system.

In some applications, in accordance with certain high-speed serial bus specifications, DC blocking capacitor 104 is specified to be placed within the constraints of a specified maximum physical distance or a specified maximum wire length of transmitter 102. Certain high-speed serial interfaces that use a differential pair of signals to transmit data to a receiver will accordingly make use of a matched, differential pair of the data transmission circuit 100. By way of example, in some applications, the DC blocking capacitor value can be in a range between 50 nF and 220 nF.

For ease of illustration and discussion, views 100, 125 and 150 depict a high-speed serial interface having a transmitter 102 located within an IC 108, and a receiver 106 located within an IC 110. Views 125 and 150 depict ICs 108 and 110 mounted onto IC packages 112 and 114, respectively, which are both further mounted onto PCB 122. It can be understood that the configurations illustrated and described herein are not to be construed as limiting. Practice of the present disclosure may also include configurations including a transmitter 102 and/or a receiver 106 that are included within ICs that are attached to different PCBs, for example, on one or more plug-in cards installed within a rack configuration. According to embodiments, it can be appreciated that certain applications can also include various other physical and electrical component configurations which are not depicted or described herein, within the scope and spirit of the present disclosure. For example, an IC package, e.g., 112 and 114, can include various 3-dimensional structures which can be used to interconnect a number of electronic components including, but not limited to ICs and discrete components.

Cross-sectional side view 125 can be useful in providing a visual and contextual understanding of an example physical and electrical implementation of data transmission circuit 100 using certain components and assembly methods. Side view 125 can be useful in illustrating relative component placement, high-speed circuit topology, and possible physical and electrical drawbacks associated with the use of such components and assembly methods. For ease of discussion and illustration, view 125 depicts a high-speed serial link between two ICs 108 and 110 mounted on the same PCB 122. It can be understood, however, that in some applications, the high-speed serial link can traverse one or more PCBs within an electronic system.

Consistent with view 100, IC 108, view 125, includes high-speed serial transmitter 102. In embodiments, IC 108 is electrically and physically interconnected to IC package 112, which is further electrically and physically interconnected to PCB 122. An electrical connection from an output of transmitter 102 to DC blocking capacitor 104 is established through wiring of IC package 112, an IC package attachment pad 120, a solder ball 116, PCB attachment pad 118 and PCB trace 126. PCB trace 126 is electrically connected to the left terminal of DC blocking capacitor 104. An electrical connection from the other (right) terminal of DC blocking capacitor 104 to the input of high-speed serial receiver 106 is established through PCB trace 128, a PCB attachment pad 118, a solder ball 116, IC package attachment pad 120 and the wiring of IC package 114, as depicted in view 125.

A singular instance of the data transmission circuit depicted in views 100 and 125, implemented on a PCB, e.g., 122, may be able to satisfy the electrical and/or physical constraints of a high-speed serial bus specification. However, in applications involving a significant number of differential high-speed serial lanes, a large number of DC blocking capacitors 104 may be required. For example, a single PCIe interface can include 16 lanes, each of which includes two differential pairs of signal wires, resulting in a total of 64 DC blocking capacitors 104 to be placed in close proximity to IC packages 112 and 114 on PCB 122. Additional instances of high-speed interfaces may require additional DC blocking capacitors 104.

A significant number of required DC blocking capacitors 104, in conjunction with PCB design and manufacturing rules/constraints, may contribute to the magnitude of the distance D1 between IC package 112 and IC package 114. The number of DC blocking capacitors 104 may also contribute to the overall length of the high-speed serial net between transmitter 102 and receiver 106, as described above.

As high-speed serial data rates increase, serial data transmission circuits become increasingly sensitive to overall wiring length, associated parasitics such as inductance, resistance and capacitance, e.g., of PCB traces 126 and 128, and wiring physical/electrical discontinuities. Such wiring discontinuities may result from indirect wiring paths, PCB vias, wire stubs and other artifacts of wires routed to/from DC blocking capacitors 104 located on a surface of PCB 122.

Increased serial data transmission circuit sensitivity to wiring characteristics can result in an overall decrease in signal integrity and resulting reliability of high-speed data transfer. Such reduced reliability can effectively limit or bound the maximum data rate of a high-speed serial data transmission circuit, which may further limit the overall performance of an electronic system, e.g., computer, including the data transmission circuit.

Cross-sectional side view 150 can be useful in providing a visual understanding of an example physical/electrical implementation of data transmission circuit 100 using certain components and assembly methods, according to embodiments of the present disclosure. Side view 150 illustrates relative component placement, high-speed serial circuit topology, and possible physical and electrical advantages associated with the use of such components and assembly methods, according to embodiments of the present disclosure.

According to embodiments, ICs 108, 110, transmitter 102, receiver 106, IC packages 112, 114, IC package attachment pads 120, PCB attachment pad 118, solder ball 116 and PCB 122 are generally consistent with the components depicted in view 125, as described above. IC packages 112 and 114 are located at a distance D2 from each other on PCB 122, view 150, in contrast to the distance D1 depicted in view 125.

According to embodiments, a DC blocking capacitor 104A of view 150 can be used to selectively replace the DC blocking capacitor 104 of view 125. DC blocking capacitor 104A has a capacitance value consistent with blocking capacitor 104, but may have different physical dimensions than capacitor 104, in order for it to be useful as an interconnect structure between IC packages 112 and 114, and PCB 122. According to embodiments, DC blocking capacitor 104A can be positioned between an IC package attachment pad 120 of IC package 112 and a PCB attachment pad 118 of PCB 122. DC blocking capacitors 104A can be used, where needed, to selectively replace SMT DC blocking capacitors, e.g., 104, and therefore conserve component placement area between IC packages 112 and 114 on PCB 122. Accordingly, the PCB traces 126, 128 of view 125 are replaced by an overall shorter PCB trace 130, view 150.

As a result, the distance D2 between IC packages 112 and 114 can be significantly reduced, relative to distance D1, view 125. The shortened distance D2 can enable the routing of shorter, more direct high-speed serial data transmission wires between ICs on a PCB. As a result, high-speed serial data wire electrical parasitics such as inductance, resistance, capacitance, and crosstalk can be effectively managed and reduced. According to embodiments, wiring excursions, stubs and other discontinuities associated with routing data transmission wires to SMT capacitors, e.g., 104, can also be managed or eliminated. In some instances, vertical traversal of wiring planes of PCB 122, through vias, can be reduced or eliminated. The management of these wiring discontinuities and electrical parasitics in conjunction with relatively short data transmission wires can be useful in enabling enhanced data transmission rates and significantly improved signal integrity for high-speed serial data transmission wires on a PCB.

According to embodiments, interconnect structures between IC packages 112, 114 and PCB 122 can include combinations of solder balls 116, DC blocking capacitors 104A and electrically conductive elements 105, also referred to as "0-ohm resistors." These structures can be selectively used together, in various combinations, as needed, to establish mechanical and electrical connections between an IC package and a PCB.

Figure 2:
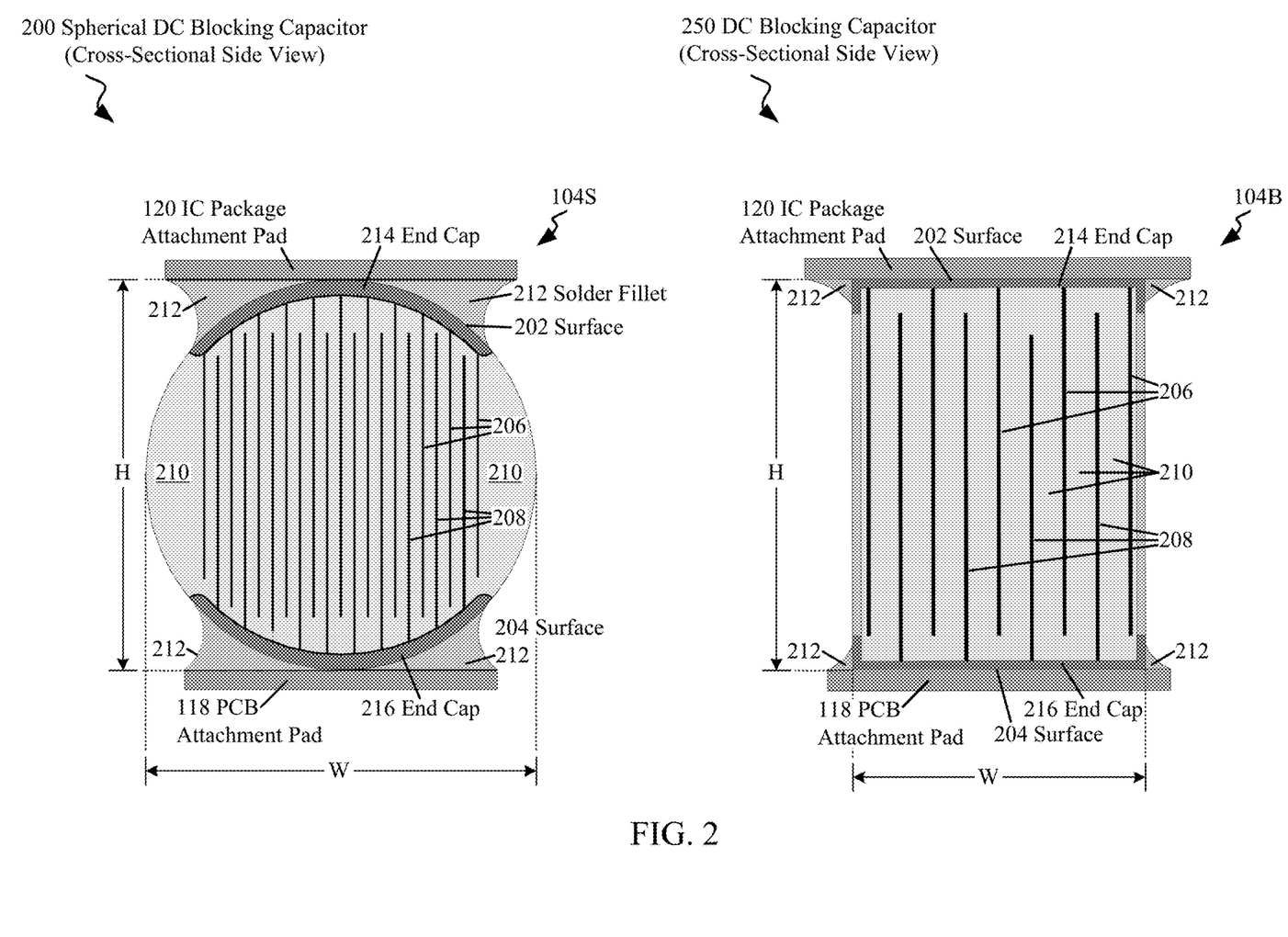
FIG. 2 depicts includes two cross-sectional side views of DC blocking capacitors, according to embodiments consistent with the figures.

FIG. 2 includes two cross-sectional side views 200 and 250 of example DC blocking capacitors. View 200 depicts a spherical DC blocking capacitor 104S, while view 250 depicts a DC blocking capacitor 104B consistent with an SMT capacitor, for example, a capacitor having an Electronic Industries Alliance (EIA) size code of "0201". According to embodiments, DC blocking capacitors 104S and 104B can be used in place of solder ball 116, FIG. 1 as IC package interconnect devices for data transmission circuits requiring DC blocking capacitors.

In embodiments, DC blocking capacitors 104S and 104B can also be used to selectively replace the SMT DC blocking capacitor 104 of view 125, FIG. 1. Such selective replacement can be useful in conserving component placement area between IC packages 112 and 114 on PCB 122, FIG. 1, view 150. DC blocking capacitors 104S and 104B can have a capacitance value consistent with blocking capacitor 104, but may have different physical dimensions than capacitor 104, in order to be useful as an interconnect structure between IC packages, e.g., 112 and 114, and PCB 122, FIG. 1. In embodiments, DC blocking capacitors 104S and 104B can be positioned between and soldered to an IC package attachment pad 120 of IC package 112 and a PCB attachment pad 118 of PCB 122, FIG. 1.

Figure 3:
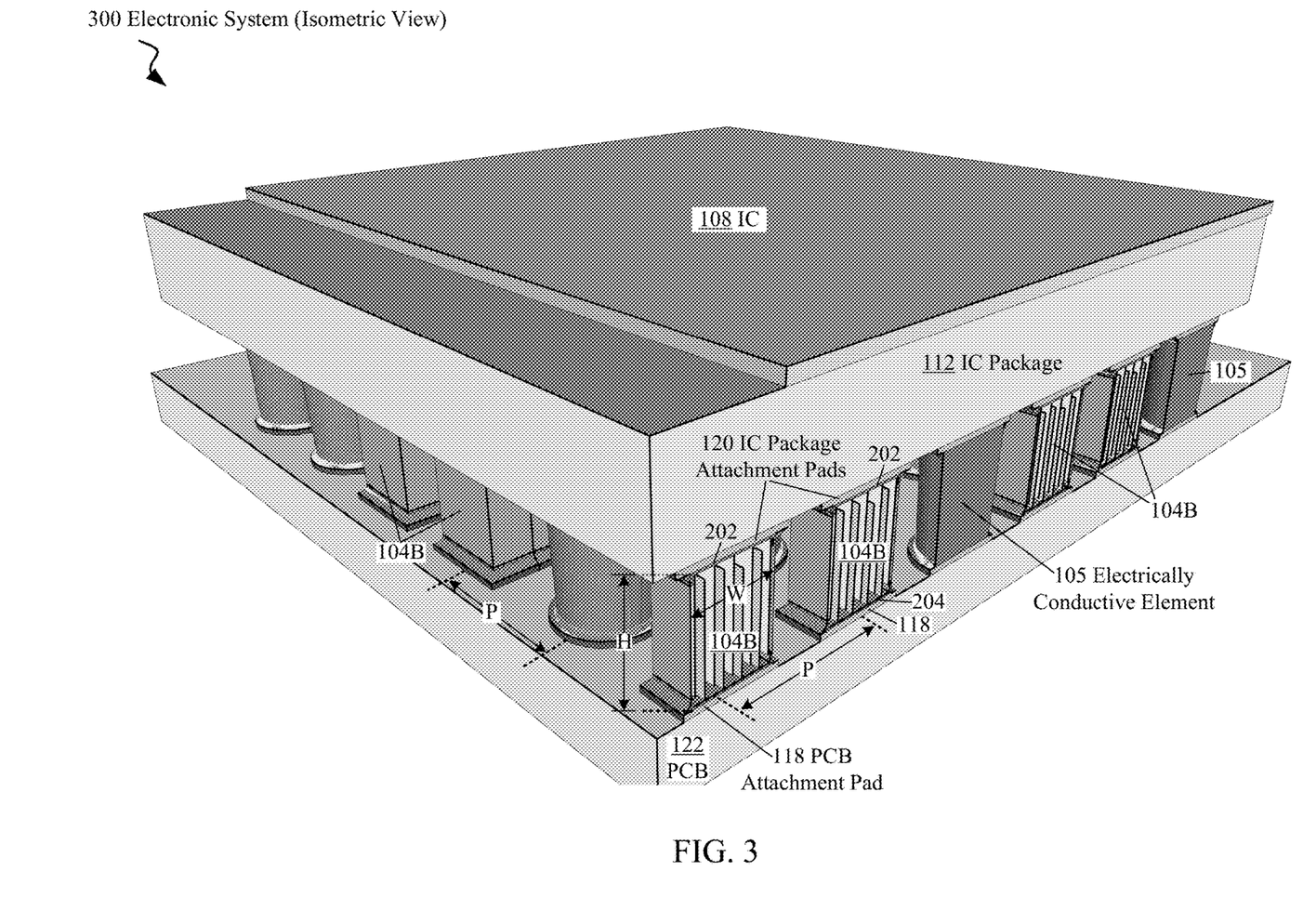
FIG. 3 is an isometric view of an electronic system including an integrated circuit (IC), an IC package, a set of direct current (DC) blocking capacitors and a printed circuit board (PCB), according to embodiments consistent with the figures.

In addition to depicting DC blocking capacitors 104S and 104B, views 200 and 250 also include IC package attachment pads 120, PCB attachment pads 118 and solder fillets 212, consistent with elements depicted in the figures, particularly FIGS. 1 and 3. These additional elements are included in views 200 and 250 to provide a visual understanding of the physical attachment, through solder joints, of DC blocking capacitors 104S and 104B to IC package attachment pads 120 and PCB attachment pads 118. In the practice of the present disclosure, IC package attachment pads 120 and PCB attachment pads 118 are features of IC packages and PCBs, respectively, as further depicted in and discussed in reference to FIGS. 1, 3 and 5.

Example DC blocking capacitors 104S and 104B each include electrically conductive end caps 214 and 216, located opposite to each other. End caps 214 and 216 have opposing surfaces 202 and 204, respectively. Surfaces 202 and 204 can be useful as areas at which DC blocking capacitors 104S and 104B can be attached, e.g., soldered, to attachment pads of an IC package and/or a PCB. Solder fillets 212 of views 200 and 250 are used to depict such attachments.

In embodiments, end caps 214 and 216, and thus, surfaces 202 and 204, respectively, are each electrically connected to a respective set of electrically conductive plates. End cap 214 is electrically connected to conductive plates 206, and end cap 216 is electrically connected to conductive plates 208. According to embodiments, conductive plates 206 are interleaved with and electrically insulated from conductive plates 208 by a dielectric material 210.

According to embodiments, the height "H" of DC blocking capacitors 104S and 104B can be specified to approximate that of corresponding, compatible solder balls, e.g., 116, FIG. 1, used in BGA assemblies. For example, the height H or distance between the surfaces 202 and 204 can be approximately 0.6 mm, which can be compatible with certain BGA electronic packages. In some embodiments, H can be in a range between 0.35 mm and 0.6 mm. The width "W" of DC blocking capacitors 104S and 104B can also be specified to be similar to or less than the diameter of compatible BGA solder balls. For example, a width W of DC blocking capacitor 104B can be approximately 0.3 mm. In some embodiments, width W can be 0.25 mm or less.

DC blocking capacitors 104S and 104B can be fabricated using processes and materials consistent with the manufacture commercially available SMT capacitors. Such fabrication processes can include the lamination and subsequent firing of several layers of ceramic green sheets having electrodes printed on their surfaces. Printed electrodes and conductive attachment surfaces, i.e., end caps, can include metals such as copper, nickel tin and silver. The dielectric ceramic green sheet material may include various formulations of fine particulate ceramic material mixed with a dispersing agent.

The spherical shape of DC blocking capacitor 104S may be approximately the same size as a traditional solder ball used to connect a BGA IC package to a PCB. However, the end caps 214 and 216 of such a spherical DC blocking capacitor may be difficult to align with PCB attachment pad 118 and IC package attachment pad 120 in one or more manufacturing processes.

Similar to DC blocking capacitor 104S, DC blocking capacitor 104B may be approximately the same height H, e.g., 0.6 mm, as a solder ball used to connect a BGA IC package to a PCB. Although the height H and width W of DC blocking capacitor 104B can be compatible with dimensions of IC package attachment pads 120 and PCB attachment pads 118, the height H to width W ratio of DC blocking capacitor 104B may make it unstable prior to and during a solder reflow operation. The effects of molten solder surface tension on the capacitor 104B, in conjunction with its relatively high H:W aspect ratio can cause capacitors 104B to fall over, or otherwise become misaligned with IC package and PCB attachment pads. Such misalignments can result in both physical and electrical failures of connections between an IC package and a PCB.

FIG. 3 is an isometric view of an example electronic system 300 including an IC 108, an IC package 112, a set of DC blocking capacitors 104B and a PCB 122, according to embodiments consistent with the figures, particularly FIG. 2, view 250. FIG. 3 can be useful in providing a visual understanding of the physical arrangement and orientation of a set of interconnect structures, e.g., DC blocking capacitors 104B and electrically conductive elements 105, arranged in an array, between an IC package 112 and a PCB 122. Consistent with the views of FIG. 1, a combination of DC blocking capacitors 104B and electrically conductive elements 105 can be selectively used, as needed, to meet the needs for electrical interconnections between IC package 112 and PCB 122.

In embodiments, IC 108 can be, for example, a central processing unit (CPU), graphics processing unit (GPU), or other type of IC that includes high-speed serial data transmission circuits. IC 108 is electrically and mechanically connected to IC package 112. IC package 112 can be, for example a ceramic or organic chip package having a set of electrically conductive IC package attachment pads 120. In embodiments, IC package attachment pads 120 can be arranged in an array having a pad-to-pad pitch "P." PCB 122 includes a set of electrically conductive PCB attachment pads 118 that correspond positionally to the set of IC package attachment pads 120. PCB 122 can include a variety of different types of PCBs such as motherboards, plug-in cards, and the like.

According to embodiments, each DC blocking capacitor 104B has an electrically conductive surface 202 interconnected, e.g., soldered, to an IC package attachment pad 120 and an electrically conductive surface 204 interconnected, e.g., soldered, to a corresponding PCB attachment pad 118. Similarly, each electrically conductive element 105 is interconnected/soldered to an IC package attachment pad 120 and to a corresponding PCB attachment pad 118.

According to embodiments, DC blocking capacitors 104B and electrically conductive elements 105, also referred to as a "0-ohm resistors," can be used to replace or supplement solder balls in the electrical and mechanical interconnection of an IC 108 to a PCB 122. In embodiments, each DC blocking capacitor 104B is electrically connected in a series configuration within a data transmission circuit, as previously depicted in FIG. 1, views 100 and 150, and described in the associated text. Accordingly, FIG. 3 depicts DC blocking capacitors 104B in only particular locations requiring DC blocking capacitors, while other interconnect locations are populated with electrically conductive elements 105, which can provide low resistance electrical connections, similar to those provided by solder balls. Electrically conductive elements 105 can include a conductive material such as copper electrically connected to conductive surfaces similar to 202 and 204. Electrically conductive elements 105 can be used for interconnections between IC package 112 from PCB 122 that do not require DC blocking capacitors, such as power, ground, and certain signal types.

According to embodiments, a portion of the DC blocking capacitors 104B can be positioned in a particular orientation, relative to PCB attachment pads 118, as depicted in FIG. 3. In some embodiments, another portion of the DC blocking capacitors 104B can be positioned in an orientation (not depicted) perpendicular to the depicted orientation. (See FIG. 6.) Positioning of DC blocking capacitors in alternate orientations can be useful in managing electrostatic and electromagnetic field interactions between adjacent DC blocking capacitors within an interconnect pin field.

According to embodiments, the DC blocking capacitors 104B depicted in FIG. 3 can be consistent with EIA "0201" capacitors, i.e., capacitors having an EIA size code of "0201." Accordingly, the height H and width W of the DC blocking capacitors 104B can be 0.6 mm and 0.3 mm, respectively. In embodiments, these dimensions can be consistent and compatible with the dimensions of BGA solder balls used to provide electrical and mechanical interconnections between IC packages and PCBs. Similarly, the attachment pad pitch P is consistent with pad pitches used for arrays of attachment pads used for BGA solder balls. By way of example, in some embodiments, the attachment pad pitch P can be 1.0 mm. The above dimensions are provided as examples; however they are not to be construed as limiting. In embodiments, a variety of SMT capacitor sizes may be used, for example, capacitors having EIA size codes of "0201," "0402" or "0603." Similarly, a variety of attachment pad pitches P, such as 0.5 mm, 0.75 mm, 0.8 mm, 1.0 mm or 1.25 mm, may be used in embodiments, as appropriate.

While it is theoretically possible to create an electronic system using an array of DC blocking capacitors 104B corresponding to an EIA 0201 size code, assembly of such a system may present particular challenges. The relatively small size of the conductive surfaces 202 and 204 at the ends of each capacitor 104B, relative to the capacitor's height (length) "H," can make them vulnerable to the effects of forces resulting from molten solder surface tension during a reflow process. Placing/aligning of capacitors as depicted, and maintaining their position through a robust reflow process may be problematic and can result in interconnect arrays with some portion of the capacitors 104B misaligned, rotated or otherwise deviating from a desired position or orientation. Embodiments discussed herein in FIGS. 4-6 include DC blocking capacitors having shapes and dimensions which may be more suitable for a robust manufacturing/assembly process.

DC blocking capacitor 104B is one of a set of DC blocking capacitors shown in FIG. 3. As can be seen in FIG. 3, the set of DC blocking capacitors 104B can be integrated with a set of electrically conductive elements 105 on PCB 122. In FIG. 3, the DC blocking capacitors, including DC blocking capacitor 104B, are indicated by overlapping lines that represent plate structures within each DC blocking capacitor 104B. Thus, the portion of the set of DC blocking capacitors 104B shown in FIG. 3 illustrates six total DC blocking capacitors. FIG. 3 is provided for illustrative purposes. In certain embodiments tens, hundreds, or thousands of components such as DC blocking capacitor 104B and electrically conductive elements 105 can be integrated into a single electronic system, e.g., 300.

Figure 4:
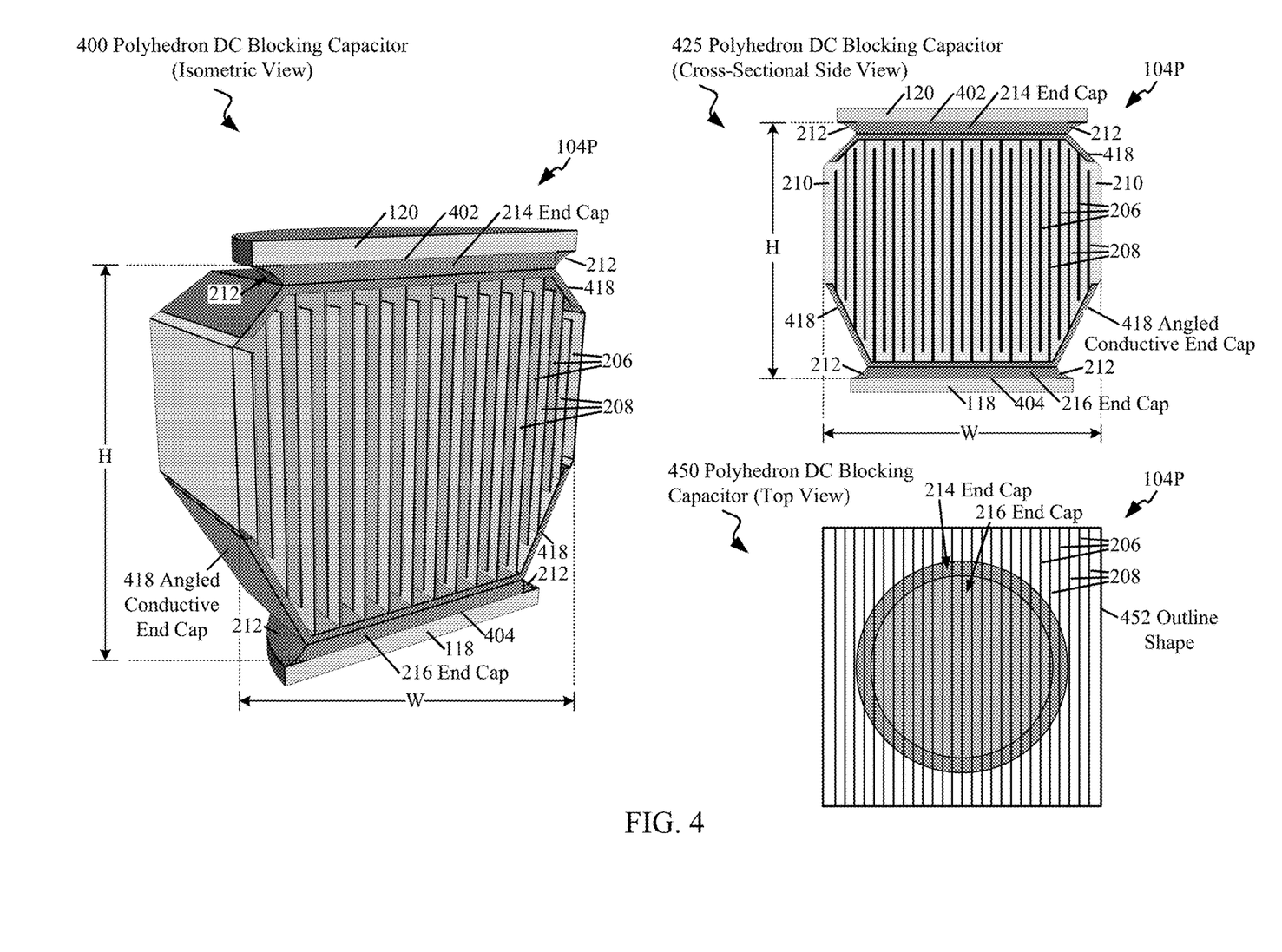
FIG. 4 includes isometric, top and side views of a DC blocking capacitor, according to embodiments consistent with the figures.

FIG. 4 includes three consistent and complementary views; isometric view 400, cross-sectional side view 425 and top view 450, each depicting a polyhedron-shaped DC blocking capacitor 104P for use with an IC package, according to embodiments consistent with the figures.

According to embodiments, DC blocking capacitor 104P can be used in place of solder ball 116, FIG. 1 as IC package interconnect devices for data transmission circuits requiring DC blocking capacitors. DC blocking capacitor 104P can be used to selectively replace the SMT DC blocking capacitor 104 of view 125, FIG. 1. Such selective replacement can be useful in conserving component placement area between IC packages 112 and 114 on PCB 122, FIG. 1, view 150. DC blocking capacitor 104P can have a capacitance value consistent with blocking capacitor 104, but may have different physical dimensions than capacitor 104, in order to be useful as an interconnect structure between IC packages, e.g., 112 and 114, and PCB 122, FIG. 1. In embodiments, DC blocking capacitor 104P can be positioned between and soldered to an IC package attachment pad 120 of IC package 112 and a PCB attachment pad 118 of PCB 122, FIG. 1.

In addition to depicting DC blocking capacitor 104P, views 400, 425 and 450 also include IC package attachment pads 120, PCB attachment pads 118 and solder fillets 212, consistent with elements depicted in the figures, particularly FIGS. 1 and 3. These additional elements are included in views 400, 425 and 450 to provide a visual understanding of the physical attachment, through solder joints, of DC blocking capacitor 104P to IC package attachment pads 120 and PCB attachment pads 118. In the practice of the present disclosure, IC package attachment pads 120 and PCB attachment pads 118 are features of IC packages and PCBs, respectively, as further depicted in and discussed in reference to FIGS. 1, 3 and 5.

Example DC blocking capacitor 104P includes electrically conductive end caps 214 and 216, located opposite to each other. End caps 214 and 216 have opposing planar surfaces 402 and 404, respectively, which are in a parallel planar orientation. Planar surfaces 402 and 404 can be useful as areas at which DC blocking capacitor 104P can be attached, e.g., soldered, to attachment pads of an IC package and/or a PCB. Solder fillets 212 of views 400 and 425 are used to depict such attachments.

In embodiments, end caps 214 and 216, and thus, planar surfaces 402 and 404, respectively, are each electrically connected to a respective set of electrically conductive plates. End cap 214 is electrically connected to conductive plates 206, and end cap 216 is electrically connected to conductive plates 208. According to embodiments, conductive plates 206 are interleaved with and electrically insulated from conductive plates 208 by a dielectric material 210.

According to embodiments, planar surface 402 of end cap 214 can have an area greater than the area of planar surface 404 of end cap 216, as illustrated in FIG. 4, particularly view 450. In some embodiments, the larger area of planar surface 402 can correspond to a width W that is greater than a width W, for example, of a corresponding DC blocking capacitor 104B, FIG. 2. The resulting relatively low H:W aspect ratio of DC blocking capacitor 104P, in conjunction with relatively large planar surface 402, can be useful in providing mechanical stability prior to and during a solder reflow process. The forces provided by molten solder surface tension on the capacitor 104P, in conjunction with a relatively large planar surface 402, can be particularly useful in preventing tipping and misalignment problems, as discussed in reference to FIG. 2, of capacitors 104P during the solder reflow process. Such increased mechanical stability can be useful in managing/minimizing both physical and electrical failures of connections between an IC package and a PCB. The relatively large planar surface 402 can also be useful in providing a robust mechanical connection of DC blocking capacitor 104P to a package attachment pad, e.g., IC package attachment pad 120.

In embodiments, angled conductive end caps 418 can be physically and electrically integrated with end caps 214 and 216. As depicted in FIG. 4, views 400 and 425, certain portions of electrically conductive plates 206 and 208 may not be able to be directly electrically connected end caps 214 and 216. Angled conductive end caps 418 can be particularly useful in electrically interconnecting these portions of electrically conductive plates 206 and 208 to end caps 214 and 216, thereby increasing the amount of capacitance which can be provided by DC blocking capacitor 104P. The angle and orientation of angled conductive end caps 418 also be useful in providing a degree of control over dimensions of solder fillets 212, which can be useful for managing physical and electrical properties of interconnections between DC blocking capacitors 104P, IC packages and PCBs.

According to embodiments, the height H of DC blocking capacitor 104P can be specified to approximate that of corresponding, compatible solder balls, e.g., 116, FIG. 1, used in BGA assemblies. For example, the height H, or distance between the planar surfaces 402 and 404 can be approximately 0.6 mm, which can be compatible with certain BGA electronic packages. In some embodiments, H can be in a range between 0.35 mm and 0.6 mm. The width W of DC blocking capacitor 104P can also be specified to be similar to or less than the diameter of compatible BGA solder balls. For example, a width W of DC blocking capacitor 104P can be approximately 0.3 mm. In some embodiments, width W can be 0.25 mm or less.

Although DC blocking capacitor 104P is depicted in view 450, FIG. 4 as having an outline shape 452 that is square, in some embodiments other outline shapes, and thus overall 3-dimensional shapes of DC blocking capacitor 104P may be implemented. For example, possible outline shapes can include, but are not limited to circular, rectangular, hexagonal, and octagonal, within the spirit and scope of the present disclosure. Corresponding 3-dimensional shapes can be cylindrical, conical, cuboid, and various types of convex polyhedra.

DC blocking capacitor 104P can be fabricated using processes and materials consistent with the manufacture of commercially available SMT capacitors. Such fabrication processes can include the lamination and subsequent firing of several layers of ceramic green sheets having electrodes printed on their surfaces. Printed electrodes and conductive attachment surfaces, i.e., end caps, can include metals such as copper, nickel tin and silver. The dielectric ceramic green sheet material may include various formulations of fine particulate ceramic material mixed with a dispersing agent.

Figure 5:
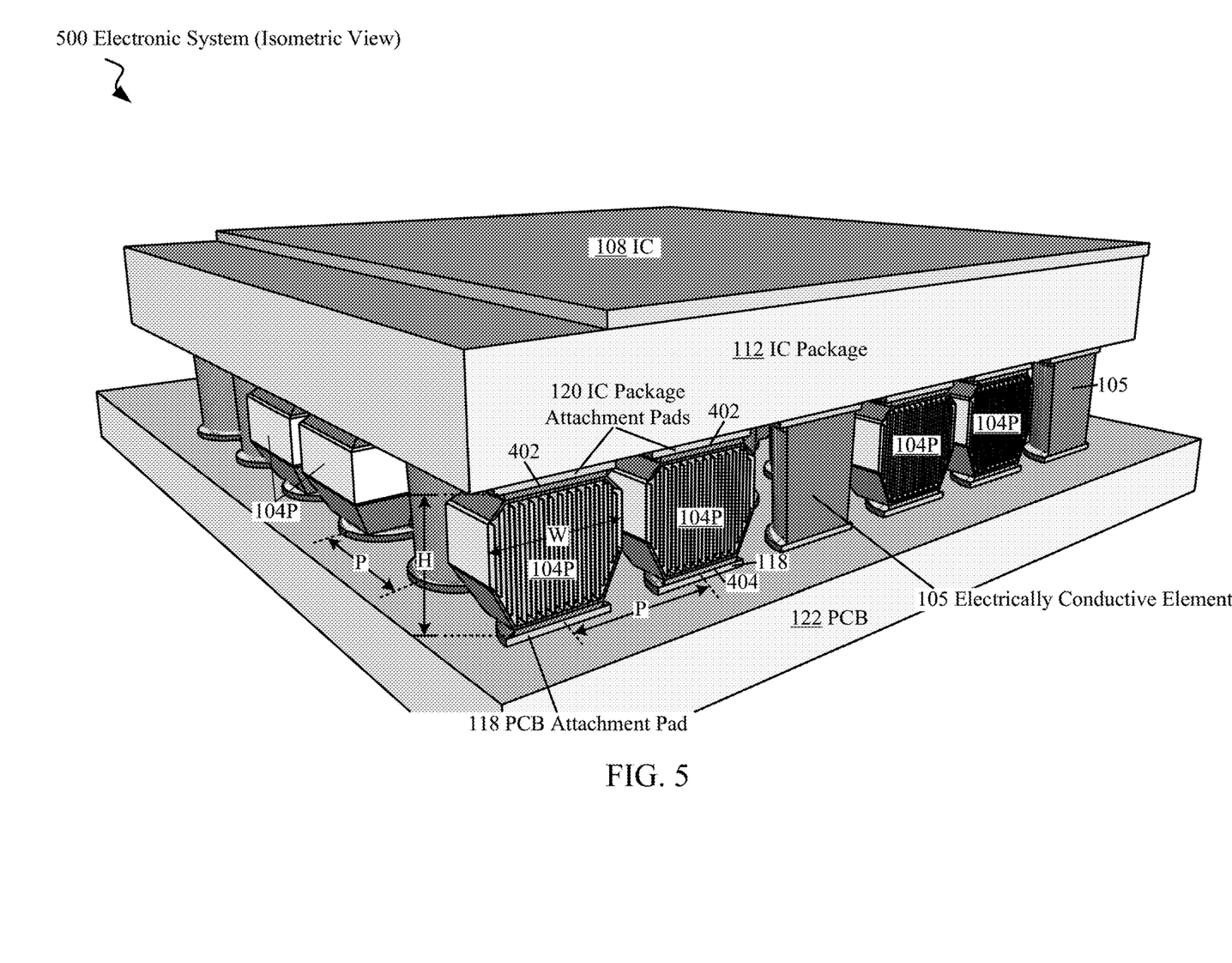
FIG. 5 is an isometric view of an electronic system including an IC, an IC package, a set of DC blocking capacitors and a PCB, according to embodiments consistent with the figures.

FIG. 5 is an isometric view of an electronic system 500 including an IC 108, an IC package 112, a set of DC blocking capacitors 104P and PCB 122, according to embodiments consistent with the figures, particularly FIG. 4. FIG. 5 can be useful in providing a visual understanding of the physical arrangement and orientation of a set of interconnect structures, e.g., DC blocking capacitors 104P, and electrically conductive elements 105, arranged in an array, between an IC package 112 and a PCB 122. Consistent with the views of FIG. 1, a combination of DC blocking capacitors 104P and electrically conductive elements 105 can be selectively used, as needed, to meet the needs for electrical interconnections between IC package 112 and PCB 122.

In embodiments, IC 108 can be, for example, a central processing unit (CPU), graphics processing unit (GPU), or other type of IC that includes high-speed serial data transmission circuits. IC 108 is electrically and mechanically connected to IC package 112. IC package 112 can be, for example a ceramic or organic chip package having a set of electrically conductive IC package attachment pads 120. In embodiments, IC package attachment pads 120 can be arranged in an array having a pad-to-pad pitch "P." PCB 122 includes a set of electrically conductive PCB attachment pads 118 that correspond positionally to the set of IC package attachment pads 120. PCB 122 can include a variety of different types of PCBs such as motherboards, plug-in cards, and the like.

According to embodiments, each DC blocking capacitor 104P has an electrically conductive planar surface 402 interconnected, e.g., soldered, to an IC package attachment pad 120 and an electrically conductive planar surface 404 interconnected, e.g., soldered, to a corresponding PCB attachment pad 118. Similarly, each electrically conductive element 105 is interconnected/soldered to an IC package attachment pad 120 and to a corresponding PCB attachment pad 118.

According to embodiments, DC blocking capacitors 104P and electrically conductive elements 105 can be used to replace or supplement solder balls in the electrical and mechanical interconnection of an IC 108 to a PCB 122. According to embodiments, each DC blocking capacitor 104P is electrically connected in a series configuration within a data transmission circuit, as previously depicted in FIG. 1, views 100 and 150, and described in the associated text. Accordingly, FIG. 5 depicts DC blocking capacitors 104P in only particular locations requiring DC blocking capacitors, while other interconnect locations are populated with electrically conductive elements 105, which can provide low resistance electrical connections, similar to those provided by solder balls. Electrically conductive elements 105 can include a conductive material such as copper electrically connected to conductive surfaces similar to 402 and 404. Electrically conductive elements 105 can be used for interconnections between IC package 112 from PCB 122 that do not require DC blocking capacitors, such as power, ground, and certain signal types.

According to embodiments, a portion of the DC blocking capacitors 104P can be positioned in a particular orientation, relative to PCB attachment pads 118, as depicted in FIG. 5. In some embodiments, another portion of the DC blocking capacitors 104P can be positioned in an orientation (not depicted) perpendicular to the depicted orientation. (See FIG. 6.) Positioning of DC blocking capacitors in alternate orientations can be useful in controlling electrostatic and electromagnetic field interactions between adjacent DC blocking capacitors within an interconnect pin field.

In embodiments, the use of DC blocking capacitors 104P can provide particular advantages when used within an electronic system 500. The replacement of DC blocking capacitor 104, FIG. 1, view 125, with DC blocking capacitors 104P in electronic system 500 can result in decreased distances between adjacent ICs/IC packages and simplified high-speed serial wiring paths having a reduced number of discontinuities. These improvements to high-speed serial wiring paths can result in increased data transmission speeds, increase reliability, simplified system design and reduced design and manufacturing costs for an electronic system 500.

As previously discussed in reference to FIG. 4, the relatively large area of planar surface 402 can provide mechanical stability during an assembly process(s) involving solder reflow to attach DC blocking capacitors 104P to an IC package and/or PCB. The stability can result in enhanced reliability of mechanical and electrical interconnections, which can in turn provide enhanced assembly process yields and lower costs for system such as electronic system 500.

DC blocking capacitor 104P is one of a set of DC blocking capacitors shown in FIG. 5. As can be seen in FIG. 5, the set of DC blocking capacitors 104P can be integrated with a set of electrically conductive elements 105 on PCB 122. In FIG. 5, the DC blocking capacitors, including DC blocking capacitor 104P, are indicated by overlapping lines that represent plate structures within each DC blocking capacitor 104P. Thus, the portion of the set of DC blocking capacitors 104P shown in FIG. 5 illustrates six total DC blocking capacitors. FIG. 5 is for provided for illustrative purposes. In certain embodiments tens, hundreds, or thousands of components such as DC blocking capacitor 104P and electrically conductive elements 105 can be integrated into a single electronic system, e.g., 500.

In the practice of the present disclosure, an electronic system designer may specify a number of design parameters and constraints useful in increasing the long-term reliability of an electronic system 500. For example, an electronic system designer can specify certain electronic package sizes, IC package and PCB materials having certain coefficients of thermal expansion (CTEs), certain attachment pad sizes, end cap/surface sizes, shapes and areas of DC decoupling caps, amounts, placement and composition of solder paste to be applied to attachment pads, and other parameters. DC blocking caps can also be employed as part of an IC socket, which may also increase long-term reliability.

Figure 6:
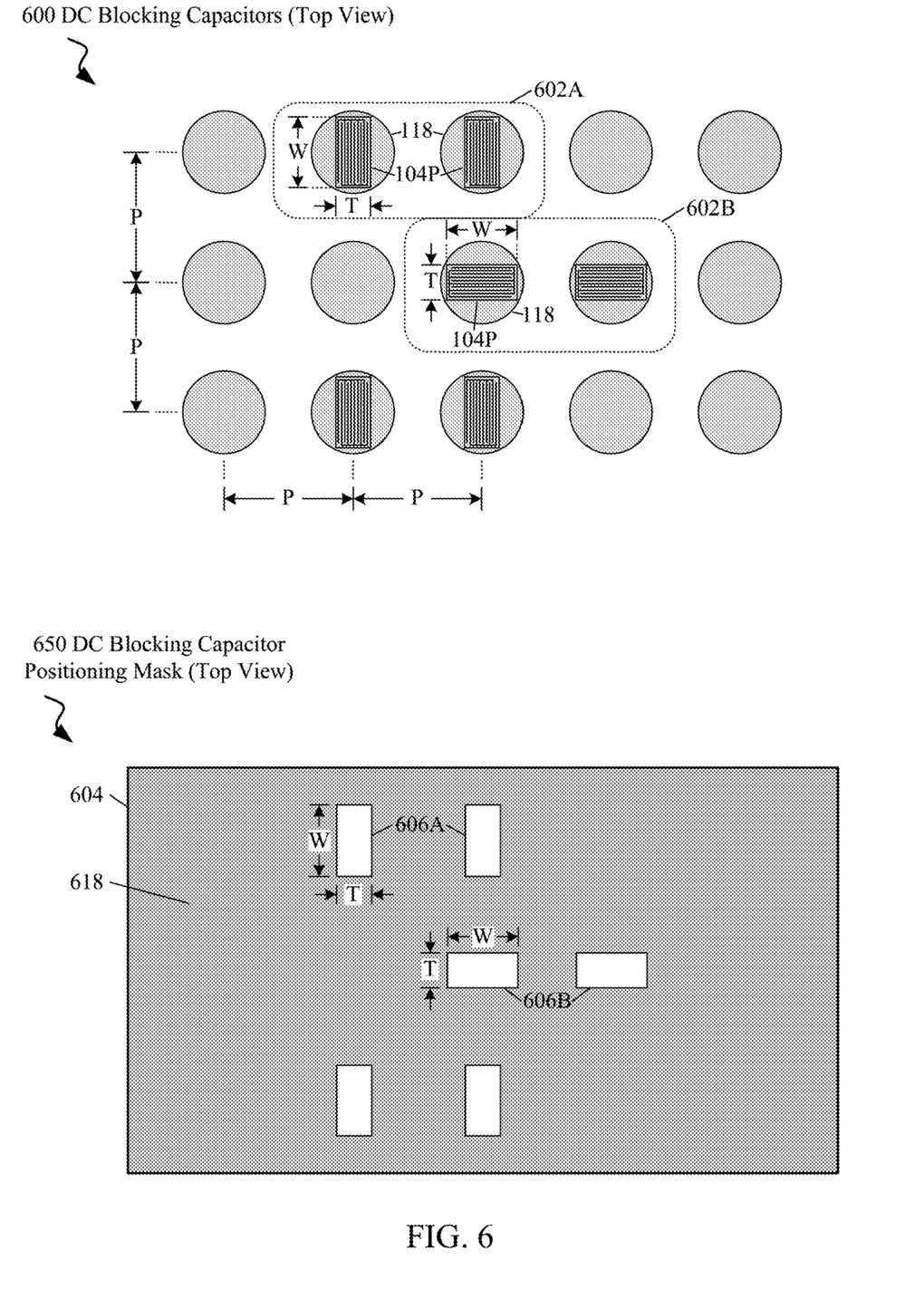
FIG. 6 includes a top view of an array of DC coupling capacitors and a top view of a DC coupling capacitor positioning mask, according to embodiments consistent with the figures.

FIG. 6 includes a top view 600 of an arrangement of DC blocking capacitors 104P, and a top view 650 of a DC blocking capacitor positioning mask 604, according to embodiments consistent with the figures. The relatively close proximity of DC blocking capacitors, e.g., 104P, FIG. 5, within an electronic system, e.g., 500, FIG. 5, can result in relatively strong interactions between both electrostatic and electromagnetic fields of adjacent and/or neighboring DC blocking capacitors. In some instances the effects of field interactions can be beneficial, and in some instances the effects of field interactions can be detrimental to the performance of an electronic system 500, FIG. 5. The additive or subtractive effects of electrostatic and electromagnetic fields between adjacent DC blocking capacitors, e.g., 104P, FIG. 5, arranged in a relatively close proximity can depend on the relative orientations of electrically conductive plates, e.g., 206 and 208, FIG. 4, of adjacent or nearby capacitors.

Views 600 and 650 can be useful in depicting an example arrangement of DC blocking capacitors 104P within an electronic system, e.g., 500, and an example mask 604 that can be useful for positioning DC blocking capacitors 104P in such an arrangement. Such arrangements of DC blocking capacitors 104P in various orientations can provide an electronic system designer with placement options for managing and utilizing the effects of field interactions between adjacent/neighboring DC blocking capacitors.

Top view 600 depicts an arrangement of DC blocking capacitors 104P and a corresponding set of PCB attachment pads 118. In embodiments, each DC blocking capacitor 104P has a thickness "T" that is less than a width W. The differences in the thickness T and the width W can be useful in the positioning of DC blocking capacitors 104P into certain orientations relative to attachment pads 118, prior to solder reflow operation. Top view 600 includes a portion of a set of DC blocking capacitors 104P within area 602A positioned in a first, vertical orientation relative to PCB attachment pads 118. A second portion of the set of DC blocking capacitors 104P is positioned, within area 602B, in a second, horizontal orientation perpendicular to the first, vertical orientation. According to embodiments, the set of PCB attachment pads 118 is arranged as a regular two-dimensional array having a pad-to-pad pitch "P," consistent with FIGS. 3 and 5.

In the design of an electronic system, a designer can use an electromagnetic field solver/simulation program to calculate interactions between electrostatic and electromagnetic fields of adjacent or nearby DC blocking capacitors 104P. Using the results of such simulations, a designer can determine a desired orientation of various DC blocking capacitors 104P that will improve or optimize integrity of signals, e.g., high-speed serial signals. In some instances, it may be beneficial to have certain adjacent DC blocking capacitors 104P in the same orientation, as depicted within the areas 602A and 602B, and in some instances, it may be beneficial to have certain adjacent DC blocking capacitors 104P in the perpendicular orientations, as depicted between the areas 602A and 602B.

According to embodiments, mask 604 can be useful in aligning DC blocking capacitors 104P in a desired orientation prior to and during solder reflow operations used to attach the capacitors to an IC package and/or a PCB. According to embodiments, mask openings 606A and 606B in mask surface 618 can be customized, as depicted in view 650, to receive DC blocking capacitors 104P in only certain desired orientation(s). In some embodiments, certain mask openings in mask surface 618 can have customized interior shapes and profiles designed to receive, for example, an electrically conductive element 105, FIG. 5, but not a DC blocking capacitor 104P. Certain other mask openings in mask surface 618 can have customized interior shapes/profiles designed to accept a DC blocking capacitor 104P, but not an electrically conductive element 105, FIG. 5. In the practice of the present disclosure, various sized and shaped openings in mask 604 can be useful in the selective positioning and alignment of a variety of components such as DC blocking capacitors and conductive interconnect structures prior to and during solder reflow operations.

Figure 7:
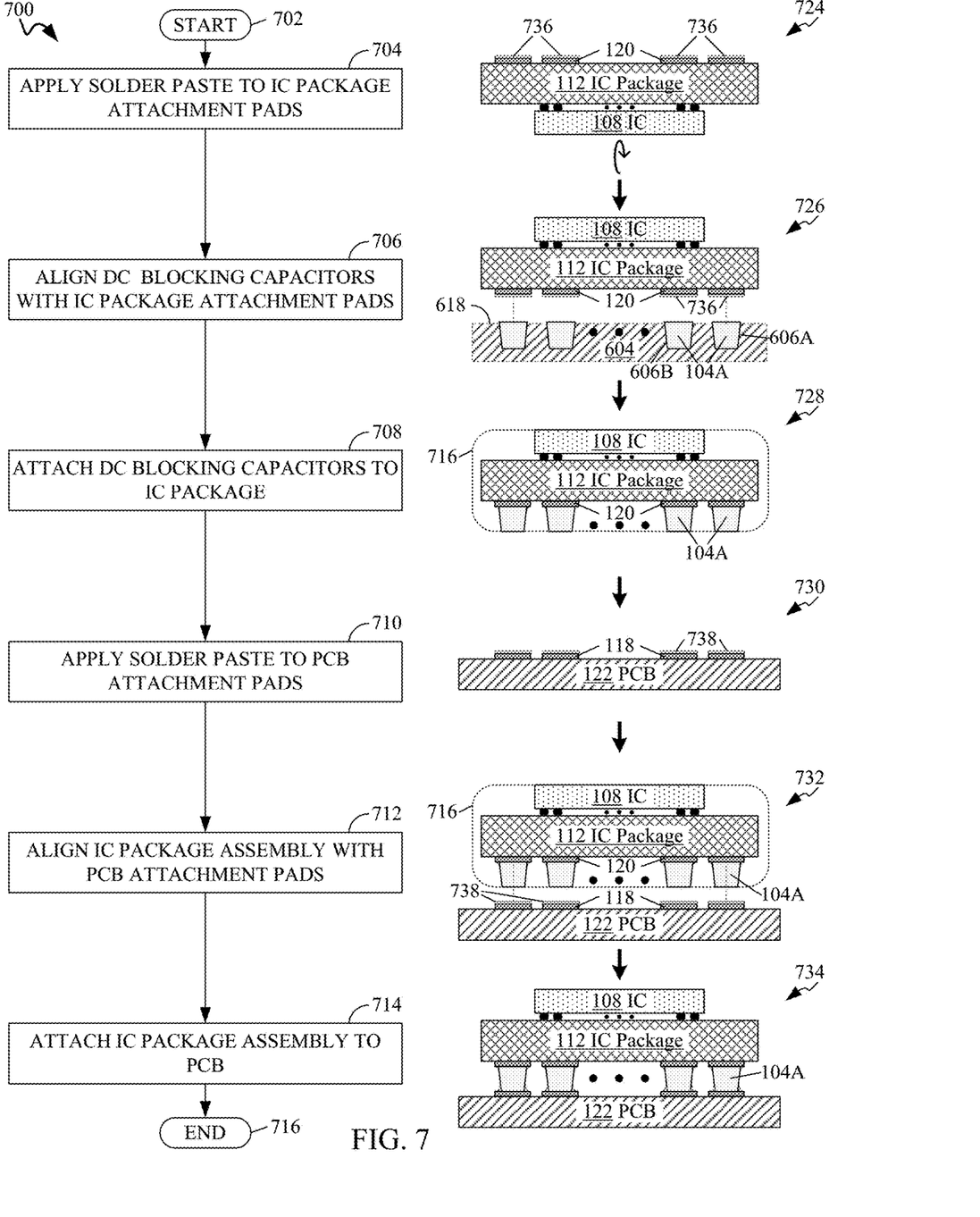
FIG. 7 includes a flow diagram and corresponding process diagram views depicting a method for attaching an IC package to a PCB with a set of DC blocking capacitors, according to embodiments consistent with the figures.

FIG. 7 includes a flow diagram 700 and a sequential set of six corresponding cross-sectional side process diagram views 724-734, depicting a method 700 for attaching an IC package to a PCB with a set of DC blocking capacitors, according to embodiments consistent with the figures. These process diagram views illustrate an example process; other views and operations can be possible. An electronic system formed by these process operations can be consistent with electronic system 500, FIG. 5, and can have enhanced signal integrity of high-speed serial interfaces and reduced PCB surface area consumed by DC blocking capacitors.

Each DC blocking capacitor is electrically connected in a series configuration within a data transmission circuit, according to embodiments. Example data transmission circuits can include a Peripheral Component Interconnect Express (PCIe), Serial Advanced Technology Attachment (SATA), or Universal Serial Bus (USB) circuit.

The execution of method 700 can result in electronic systems, e.g., 500, FIG. 5, having a reduction in PCB area used by DC blocking capacitors, e.g., 104, FIG. 1, and a reduction in distance between adjacent ICs mounted on the same PCB. According to embodiments, such electronic systems can also have enhanced signal integrity and data transmission speeds for high-speed serial data buses that incorporate DC blocking capacitors. Embodiments of the present disclosure are generally consistent with existing ICs, electronic packages, PCBs, as well as existing design methodologies and electronic system fabrication technologies and methods.

The progression depicted in views 724-734 begins with an IC 108 mounted on a IC package 112, view 724, and ends with a completed electronic system in view 734. Process operations can be completed using processes and materials presently used for electronic system fabrication, such as alignment and solder processes, and solder pastes 736 and 738.

For ease of discussion, the present discussion is directed towards the use of solder paste and solder reflow operations used to establish durable mechanical and electrical connections between an IC package and a PCB. It can be understood, however, that within the scope and spirit of the present disclosure that other types of conductive attachment materials such as conductive epoxies and conductive elastomers can be used for the purpose of establishing such durable mechanical and electrical connections. Accordingly, it can also be understood that, according to embodiments, particular variations of process operations described herein may be used to affix such conductive attachment materials to an IC package and/or a PCB.

For ease of illustration, DC blocking capacitors 104A are included within the views 724-734 as generic representations of DC blocking capacitors. It can be understood that DC blocking capacitors 104A depicted herein in FIG. 7 can represent any of the various DC blocking capacitors depicted and described herein, e.g., 104A, FIG. 1, 104B, FIG. 2, 104S, FIG. 2, or 104P, FIG. 4.

The results of one or more process operations may be depicted in each view. For example, a view can depict the results of an attachment process, which can also include placement, alignment, and solder reflow operations that support the attachment process. Processing operations associated with views 724-734 can include, but are not limited to solder application, packaged IC movement and alignment, DC blocking capacitor placement/alignment, and solder reflow operations.

Completed structures may be generally shown in views 724-734 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

Unless explicitly directed towards another figure or view, it can be understood that textual references to figure elements contained within a discussion of an operation of method 700 generally refer to a corresponding view immediately to the right of the discussed operation box of flow diagram 700.

Method 700 moves from start 702 to operation 704. Operation 704 generally refers to applying solder paste to IC package attachment pads 120 of the IC package 112. View 724 depicts an IC 108 that is electrically and mechanically attached to an IC package 112. The IC package 112 includes a set of IC package attachment pads 120, attached to a planar surface of the IC package 112. View 724 depicts the IC package attachment pads 120 following the application of solder paste 736. According to embodiments, the solder paste 736 can be applied to IC package attachment pads 120 through the use of a stencil. In embodiments, solder paste 736 is generally a high-temperature solder paste chosen so that temperature excursions experienced during a subsequent second reflow operation involving a lower temperature solder paste do not cause the high-temperature solder paste to melt a second time. Once the solder paste is applied to the IC package attachment pads, the method 700 moves to operation 706.

Operation 706 generally refers to aligning a set of DC blocking capacitors with corresponding positions of IC package attachment pads. View 726 is generally consistent with the views 600 and 650 of FIG. 6. View 726 depicts an IC 108 and IC package 112 having the set of IC package attachment pads 120 aligned with a corresponding set of DC blocking capacitors 104A. View 726 depicts the IC package attachment pads 120 following the application of solder paste 736. In some embodiments, DC blocking capacitors 104A can be aligned and positioned adjacent to solder paste 736 through the use of pick and place equipment, generally consistent with equipment used to populate PCBs with SMT components.

In some embodiments, DC blocking capacitors 104A can be aligned through the use of a mask 604, as depicted in, and described in reference to FIG. 6. A quantity of DC blocking capacitors 104A can be placed onto the mask surface 618 of mask 604. In some embodiments, the mask 604 can be vibrated to cause seating the DC blocking capacitors 104A into the set of openings, e.g., 606A, in the surface of the mask 604. DC blocking capacitors 104A that remain unseated after a period of time can be subsequently removed from the mask surface 618. This process may be repeated multiple times in order to seat DC blocking capacitors 104A and electrically conductive elements 105. In accordance with FIG. 6 and the associated description, mask openings having various sizes, orientations and profiles may be used to selectively align certain types of DC blocking capacitors 104A and electrically conductive elements 105 in certain corresponding locations corresponding to IC package attachment pad 120. In some embodiments pick and place machinery may be used to populate openings, e.g., 606A, with appropriate DC blocking capacitors 104A.

As depicted in and described in reference to FIG. 6, a width W that is different than a thickness T of DC blocking capacitors 104A can be used to position DC blocking capacitors 104A in certain orientations corresponding to certain mask openings 606A of mask 604. According to embodiments, once mask 604 has been populated, it can be aligned with IC package 112, for example, through the use of robotic equipment having optical sensors. Such optical sensors may detect alignment or fiducial marks on both mask 604 and IC package 112, or upon a carrier containing IC package 112. Once the set of DC blocking capacitors 104A is aligned with the corresponding IC package attachment pads, the method 700 moves to operation 708.

Operation 708 generally refers to attaching the set of DC blocking capacitors 104A to the corresponding set of IC package attachment pads 120. View 728 depicts an IC 108 and IC package 112 having the set of IC package attachment pads 120 adjacent to a corresponding set of DC blocking capacitors 104A. According to embodiments, the aligned set of DC blocking capacitors 104A is positioned so that a (top) surface of each DC blocking capacitor 104A is adjacent to a corresponding IC package attachment pad 120. This positioning may be done by automated or manual assembly equipment such that the top surface of each DC blocking capacitor 104A is pressed against the solder paste 736. Following to this positioning, the IC package assembly 716 including IC 108, IC package 112 and DC blocking capacitors 104A is subjected to a heating operation that reflows solder paste 736 to form a connection between IC package attachment pads 120 and DC blocking capacitors 104A. According to embodiments, the set of DC blocking capacitors 104A is held in position against the corresponding set of IC package attachment pads 120 for the duration of the reflow process, until the reflowed solder connection is mechanically stable. Once the set of DC blocking capacitors 104A is attached to the IC package attachment pads 120, the method 700 moves to operation 710.

Operation 710 generally refers to applying solder paste to a set of PCB attachment pads. View 730 depicts the PCB 122 that includes a set of PCB attachment pads 118, attached to a planar surface of the IC package 112, following the application of solder paste 738. According to embodiments, the solder paste 738 can be applied to PCB attachment pads 118 through the use of a stencil. In embodiments, solder paste 738 is generally a low-temperature or eutectic solder paste chosen so that temperature excursions experienced during a subsequent second reflow operation do not cause the high-temperature solder paste, reflowed in operation 708, to melt a second time. Once the solder paste 738 is applied to the PCB attachment pads, the method 700 moves to operation 712.

Operation 712 generally refers to aligning an IC package assembly with a corresponding set of PCB attachment pads. View 732 depicts an IC package assembly 716 having the set of DC blocking capacitors 104A aligned with a corresponding set of PCB attachment pads 118. View 732 depicts the set of PCB attachment pads 118 following the application of solder paste 738. According to embodiments, IC package assembly 716 can be aligned with PCB 122, for example, through the use of robotic equipment having optical sensors. Such optical sensors may detect alignment or fiducial marks on both IC package assembly 716 and PCB 122, and/or upon a carrier containing IC package assembly 716. Once the IC package assembly 716 is aligned with the corresponding set of PCB attachment pads, the method 700 moves to operation 714.

Operation 714 generally refers to attaching the IC package assembly 716 to the corresponding set of PCB attachment pads 118. View 734 depicts an IC package assembly 716 and PCB 122 having the set of DC blocking capacitors 104A adjacent to the corresponding set of PCB attachment pads 118. According to embodiments, the aligned IC package assembly 716 is positioned so that a (bottom) surface of each DC blocking capacitor 104A is adjacent to a corresponding PCB attachment pad 118. This positioning may be done by automated or manual assembly equipment such that the bottom surface of each DC blocking capacitor 104A is pressed against the solder paste 738. Subsequent to this positioning, the IC package assembly 716 and PCB 122 are subjected to a heating operation that reflows solder paste 738 to form a connection between DC blocking capacitors 104A and PCB attachment pads 118. According to embodiments, the set of DC blocking capacitors 104A is held in position against the corresponding set of PCB attachment pads 118 for the duration of the reflow process, until the reflowed solder connection is mechanically stable. Once the IC package assembly is attached to the corresponding set of PCB attachment pads, the method 700 may end at block 716.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A direct current (DC) blocking capacitor for use with an integrated circuit (IC) package, the DC blocking capacitor comprising:
 a first electrically conductive planar surface having a first width;
 a second electrically planar surface having a second width, the second planar surface in a parallel planar orientation to the first planar surface;
 a first set of electrically conductive plates electrically connected to the first planar surface; and
 a second set of electrically conductive plates electrically connected to the second planar surface, the second set of electrically conductive plates interleaved with and electrically insulated from the first set of electrically conductive plates by a dielectric material,
 wherein an overall width of the DC blocking capacitor is greater than the first width and the second width.

2. The DC blocking capacitor of claim 1, wherein upper and lower widths of the DC blocking capacitor are less than the overall width.

3. The DC blocking capacitor of claim 1, wherein the width of the DC blocking capacitor is different than a thickness of the DC blocking capacitor.

4. The DC blocking capacitor of claim 1, wherein a distance between the first electrically conductive planar surface and the second electrically conductive planar surface is in a range between 0.35 mm and 0.6 mm.

5. The DC blocking capacitor of claim 1, wherein an outline shape of the first electrically conductive planar surface and an outline shape of the second electrically conductive planar surface are each selected from the group consisting of: a circle, a rectangle, a hexagon, and an octagon.

6. The DC blocking capacitor of claim 1, wherein a capacitance of the DC blocking capacitor is in a range between 50 nF and 220 nF.

7. A method of attaching an integrated circuit (IC) package to a printed circuit board (PCB) with a set of direct current (DC) blocking capacitors, the method comprising:
 applying a conductive attachment material to a first set of attachment pads located on a first planar surface of the IC package;
 aligning the set of DC blocking capacitors in accordance with corresponding positions of the first set of attachment pads;
 attaching the set of DC blocking capacitors to the IC package by:
  positioning the aligned set of DC blocking capacitors so that a first surface of a first DC blocking capacitor of the set of DC blocking capacitors is adjacent to a corresponding attachment pad of the first set of attachment pads; and
  connecting the conductive attachment material to the IC package and to the first surface of the first DC blocking capacitor to create an IC package assembly; and
 electrically connecting each DC blocking capacitor of the set of DC blocking capacitors in a series configuration within a data transmission circuit,
 wherein the alignment of the set of DC blocking capacitors
 includes insertion of the set of DC blocking capacitors into a set of openings in a surface of a mask configured to receive the set of DC blocking capacitors, the positions of the set of openings corresponding to the positions of the first set of attachment pads.

8. The method of claim 7, wherein:
 the first surface of the first DC blocking capacitor of the set of DC blocking capacitors is a planar surface having a first area; and
 a second surface of the first DC blocking capacitor is a planar surface having a second area greater than the first area, the second surface in a parallel planar orientation to the first surface.

9. The method of claim 7, wherein the insertion is performed by automated pick and place machinery.

10. The method of claim 7, wherein the aligning of the set of DC blocking capacitors includes:
 positioning, in a first orientation, a first DC blocking capacitor of the set of DC blocking capacitors, according to a width of the first DC blocking capacitor that is different than a thickness of the first DC blocking capacitor; and
 positioning, in a second orientation perpendicular to the first orientation, a second DC blocking capacitor of the set of DC blocking capacitors, according to a width of the second DC blocking capacitor that is different than a thickness of the second DC blocking capacitor.

11. The method of claim 7, wherein the insertion the set of DC blocking capacitors into the mask is performed through:
 placing a plurality of DC blocking capacitors onto the surface of the mask;
 vibrating the mask to cause seating the DC blocking capacitors into the set of openings in the surface of the mask; and
 removing unseated DC blocking capacitors from the surface of the mask.

12. The method of claim 7, wherein applying the conductive attachment material includes use of at least one stencil.

13. The method of claim 8, wherein the conductive attachment material is selected from the group consisting of: a solder paste, a conductive epoxy, and a conductive elastomer.

* * * * *